United States Patent [19]

Lee et al.

[11] Patent Number: 5,726,933
[45] Date of Patent: Mar. 10, 1998

[54] CLIPPED SINE SHAPED WAVEFORM TO REDUCE THE CYCLING-INDUCED ELECTRON TRAPPING IN THE TUNNELING OXIDE OF FLASH EEPROM

[75] Inventors: Jian-Hsing Lee, Hsin-Chu; Kuo-Reay Peng, FounSan; Juang-Ke Yeh, Hsin-Chu; Ming-Chou Ho, Taichung, all of Taiwan

[73] Assignee: Taiwan Semiconductor Manufacturing Company, Ltd., Hsin-Chu, Taiwan

[21] Appl. No.: 857,162

[22] Filed: May 15, 1997

[51] Int. Cl.⁶ ................................................ G11C 16/06
[52] U.S. Cl. ........................ 365/185.18; 365/185.29; 365/218
[58] Field of Search .................. 365/185.18, 185.19, 365/185.29, 185.28, 218

[56] References Cited

U.S. PATENT DOCUMENTS

| | | |
|---|---|---|
| 5,042,009 | 8/1991 | Kazerounian et al. ............... 365/185 |
| 5,410,511 | 4/1995 | Michiyama ........................... 365/218 |
| 5,485,423 | 1/1996 | Tang et al. ........................... 365/185 |
| 5,526,315 | 6/1996 | Kaya et al. ........................ 365/185.18 |
| 5,568,439 | 10/1996 | Harari ................................. 365/218 |
| 5,600,592 | 2/1997 | Atsumi et al. ................... 365/185.18 |

*Primary Examiner*—Son T. Dinh
*Attorney, Agent, or Firm*—George O. Saile; Stephen B. Ackerman; William J. Stoffel

[57] ABSTRACT

The present invention provides method to erase and program flash EEPROMS devices using a clipped sine waveform (Vg). The clipped sine waveform reduces the tunneling oxide electric field between the floating gate and the source or drain region thereby reducing electron trapping. The method for the erase cycle comprises: applying a positive voltage to a source region; grounding a well region; floating the drain region; and simultaneously applying a negative clipped sine waveform voltage to a control gate during the erase cycle. The program cycle of the invention comprises: applying a voltage to a drain region; grounding a well region; floating a source region; and simultaneously applying a clipped sine waveform voltage to the control gate whereby the clipped sine waveforms reduce the electric field in a tunnel oxide layer which reduces the electron trapping.

10 Claims, 5 Drawing Sheets

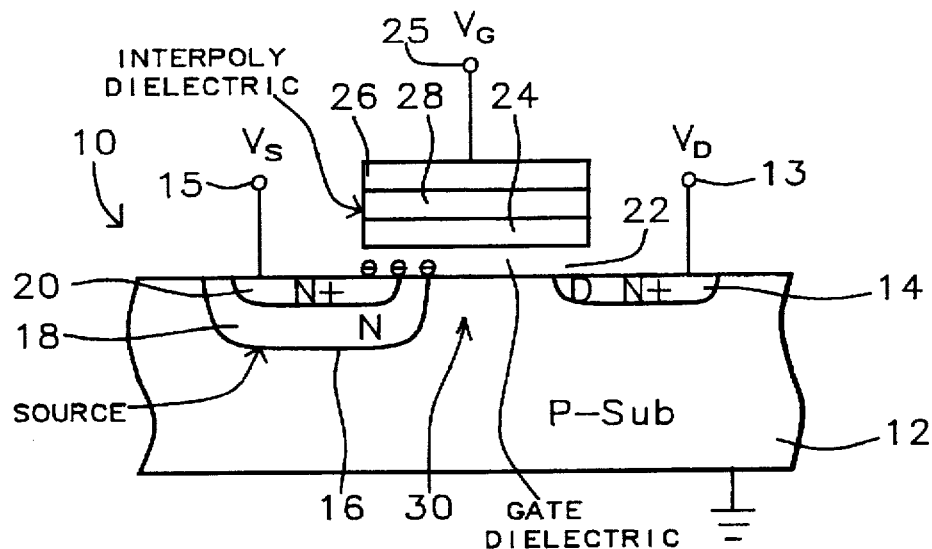
FIG. 1A – Prior Art
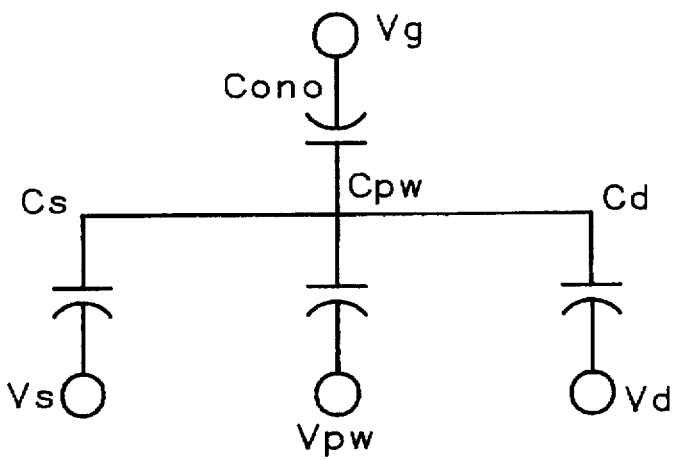
FIG. 1B – Prior Art
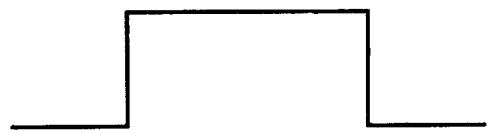
FIG. 1C – Prior Art

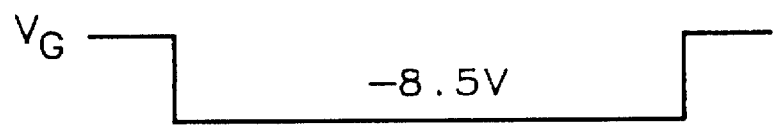
FIG. 3A - Prior Art
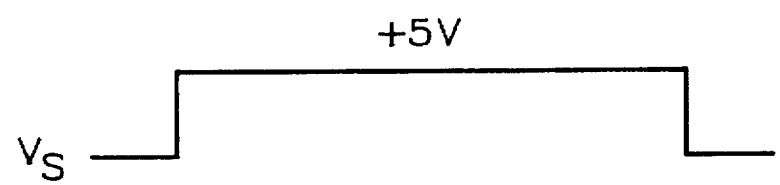
FIG. 3B - Prior Art
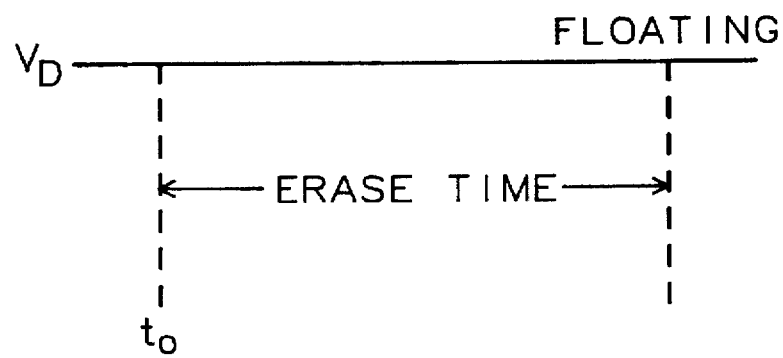
FIG. 3C - Prior Art

CLIPPED SINE SHAPED WAVEFORM TO REDUCE THE CYCLING-INDUCED ELECTRON TRAPPING IN THE TUNNELING OXIDE OF FLASH EEPROM

BACKGROUND OF INVENTION

1. Field of the Invention

This invention relates generally to floating gate memory devices such as an array of flash electrically erasable and programmable read-only memory devices (EEPROMS). More particularly, the present invention is directed to a new and improved method for eliminating of cycling-induced electron trapping in the tunneling oxide of flash EEPROMS.

2. Background of the Invention

Flash EEPROMS have recently emerged as an important memory device by combining the advantages of EPROM density with EEPROM electrical erasability. Such flash EEPROM's provide electrical erasing and a small cell size. FIG. 1 illustrates a prior art cross-sectional view of a flash EEPROM cell 10. The EEPROM cell is formed of a substrate 12, typically of a p-type conductivity, having embedded therein an n+ drain region 14 and a n-type double-diffused source region 16. The double-diffused source region 16 is formed of a deeply diffused but highly doped n-junction 18 and a more heavily doped but shallower n+ junction 20 embedded within the deep n-junction 18. The deeply diffused n-junction 18 is typically formed by using a phosphorus implant, and the shallower junction 20 is typically formed by using an arsenic implant after the phosphorus implant.

A relatively thin gate dielectric layer 22 (i.e., tunnel oxide, oxide having a uniform thickness of about 100 Å) is interposed between the top surface of the substrate 12 and a conductive polysilicon floating gate 24. A polysilicon control gate 26 is insulated above the floating gate 24 by an inter-poly dielectric 28. A channel region 30 in the substrate 12 separates the drain region 14 and the source region 16. Further, there are provided terminal pins 15, 25, and 13 for applying a source voltage Vs to the source region 16, a gate voltage Vg, to the control gate 26, and a drain voltage Vd to the drain region 14, respectively.

In conventional operation, the flash EEPROM cell of FIG. 1 is "programmed" by applying a relatively high voltage V, (approximately +9 volts) to the control gate via the terminal pin 25 and a moderately high voltage Vd (approximately −5 volts) to the drain region 14 via the terminal pin 13 in order to produce "hot" (high energy) electrons in the channel 30 near the drain region 14. The source region 16 is connected to a ground potential (Vs=0) via the terminal pin 15. The hot electrons are generated and accelerated across the gate dielectric 22 and onto the floating gate 24 and become trapped in the floating gate since the floating gate is surrounded by insulators. As a result, the floating gate threshold may be increased by three to five volts. This change in the threshold voltage, or channel conductance, of the cell created by the trapped hot electrons is what causes the cell to be programmed.

In order to erase the flash EEPROM cell of FIG. 1, a positive voltage Vs is applied to the source region 16 via the terminal pin 15 while the control gate 26 via the terminal pin 25 is either grounded (Vg=0) or biased to a negative voltage dependent upon whether the positive voltage Vs applied to the source region 16 has a value of +12 V or +5 V. In a "12 Volt flash EEPROM" device, the bias condition of Vs=+12V and Vg=0 is used. In a "5 Volt Only flash EEPROM" device, the bias condition of Vs=+5 V and Vg=−8.5 V is used. The drain region 14 is usually allowed to float. Under either of these conditions, a strong electric field is developed across the tunnel oxide between the floating gate and the source region. The electrons trapped in the floating gate flow toward a cluster at the portion of the floating gate overlying the n+-type source region 16 and are extracted from the floating gate 24 to the source region 16 by way of Fowler-Nordheim (F-N) tunneling.

However, some of the electrons will remain trapped in the tunnel oxide adjacent the top surface of the substrate 12 as depicted in FIG. 1. This electron trapping will occur in the whole memory array and will tend to increase the erase time as a function of the number of program/erase cycles. As the number of program/erase cycles goes beyond the 100,000 number, the erase time required to erase every cell in the entire memory array to a certain threshold $V_T$ in order to pass the erase verify mode of operation will exceed the time limit of 10 seconds. It is generally assumed that if the entire memory array cannot be erased within the time limit of 10 seconds (i.e., 1 pulse/10 ms or 1,000 pulses), a cycling failure is considered to have occurred.

Therefore, the problem of electron trapping in the tunneling oxide to reduce the tunneling electric field for such conventional EEPROM devices is of a major concern since it causes the erase time to be prolonged beyond the limit of 10 seconds (i.e., 1 pulse/10 ms), thereby significantly limiting the endurance of the cells. As used herein, the term "endurance" refers to the number of times the memory cells in the array may be re-programmed and erased. Consequently, the electron trapping problem greatly reduces the endurance of the cells to be areas than 100,000.

In addition, some EEPROMS devices use Fowler-Nordheim (FN) tunneling in both the erase and program cycles. The above electron trapping problem slows the program cycle also. FIGS. 3A–3C, show the conventional square pulse waveforms used in conventional EEPROM erase cycles. The inventor realized that the electron trapping problem could be reduced by modifying the conventional waveforms for the program and erase cycles.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,485,423 (Tang) which shows a method for applying a relative low positive voltage to a source region of an EEPROM during the erase cycle. U.S. Pat. No. 5,042,009 (Kazerounian) shows a method of programming a floating gate using a charge pump to provide a drain current. U.S. Pat. No. 5,410,511 (Michiyama) shows a method of erasing a flash memory.

However, there is still a need for a method to further eliminate electron trapping in flash EEPROM cells.

SUMMARY OF THE INVENTION

Accordingly, it is a general object of the present invention to provide an improved method to reduce electron trapping in EEPROMS which overcomes the disadvantages of the prior art erase and program methods.

It is an object of the present invention to provide an improved method for eliminating of cycling-induced electron trapping in the tunnelling oxide of flash EEPROMS which is realized by applying a sine clipped waveform for the Vg in the program and erase cycles.

It is another object of the present invention to provide an improved method for eliminating the cycling-induced electron trapping in the tunneling oxide of flash EEPROMS which is realized by applying a sine clipped waveform voltage on the control gate throughout the erase condition.

It is still another object of the present invention to provide an improved method for eliminating the cycling-induced electron trapping in the tunnelling oxide of flash EEPROM's which reduces significantly the high Electric field (in the tunnel oxide) and high injection at the initial time of program and erase.

To accomplish these objectives, the present invention provides method to erase and program flash EEPROMS devices using a clipped sinuate form. The electrons injected at the floating gate in the low voltage reduces the electric field between the floating gate and the source or drain region at the high voltage thereby reducing electron trapping. The method for eliminating of cycling-induced electron trapping in the tunneling oxide of flash EEPROM devices during an erase cycle comprises the steps of:

a) FIG. 4B applying a relatively low voltage (Vs) to a source region of the EEPROM devices during an entire erase cycle;

b) FIG. 4C applying a grounded voltage ($V_{well}$) to a well region of the EEPROM devices during an entire erase cycle;

c) FIG. 4D floating a drain region of the EEPROM devices during an entire erase cycle; and d) FIG. 4A simultaneously applying a negative clipped sine waveform voltage to a control gate of the EEPROM devices during the entire erase cycle whereby the sine waveforms reduce the electric field which reduces the electron trapping.

The invention's method for eliminating of cycling-induced electron trapping in the tunnelling oxide of flash EEPROM devices in a program cycle comprising the steps of:

a) applying a negative voltage to a drain region of said EEPROM devices during an entire program cycle;

b) grounding a well region of said EEPROM devices during an entire program cycle;

c) floating a source region of said EEPROM devices during an entire program cycle; and d) simultaneously applying a positive sine waveform voltage to a control gate (Vg) of said EEPROM devices during the entire program cycle whereby the sine waveforms reduce the electric field in the tunnel oxide which reduces the electron trapping.

The clipped sine waveform of the invention reduces electron trapping in memory devices, such as flash EEPROM devices during both program and erase cycles and thereby increases the performance of these devices. The clipped sine waveform ($V_{cg}$) of the invention reduces the electric field at the tunneling oxide.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A shows a cross-sectional view of a conventional flash EEPROM cell, illustrating the trapped electrons in the tunneling oxide according to the prior art.

FIG. 1B shows a capacitance model of an EEPROM device of the prior art.

FIG. 1C shows a conventional square pulsed wave form according to the prior art.

FIGS. 3(a)–3(c) are conventional rectangular waveforms of the voltages applied to the respective control gate, source, and drain over the erase condition in accordance with the prior art.

DETAILED DESCRIPTION OF THE PREFERRED EMBODIMENTS

The present invention will be described in detail with reference to the accompanying drawings. The present invention provides a method to erase and program flash EEPROMS devices using a clipped sine waveform. See FIGS. 2A and 2B. The clipped sine waveform reduces the electric field in the tunnel oxide between the floating gate and the source or drain region thereby reducing electron trapping.

I. Erase Cycle of the invention

Figure 2A:
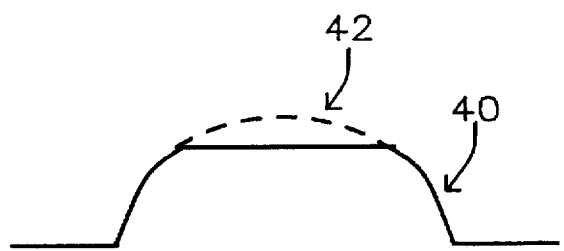
FIG. 2A (solid line) shows the clipped sine waveform of the present invention compared to a sine wave (dashed line).

The invention's erase cycle method for eliminating of cycling-induced electron trapping in the tunneling oxide of flash EEPROM devices is illustrated in FIGS. 4A–4B 4C and 4D. As shown in FIGS. 4A, 4B, 4C, and 4D, the invention's erase cycle is uses a clipped sine waveform to apply voltages to the memory device. FIG. 2A shows the clipped sine waveform 40 (solid line) of the invention and a sine waveform 42 (dashed line).

As shown in FIGS. 4A, 4B, 4C and 4D, a low voltage (Vs) is applied to a source region of the EEPROM devices during an entire erase cycle. A grounded voltage ($V_{well}$) is applied to a well region of the EEPROM devices during an entire erase cycle. The drain region of the EEPROM devices is preferably left floating ($V_d$) during an entire erase cycle. A negative clipped sine waveform voltage (Vg or $V_{cg}$ is applied to a control gate of the EEPROM devices during the erase cycle whereby the sine waveforms reduce the electric field which reduces the electron trapping.

Figure 2B:
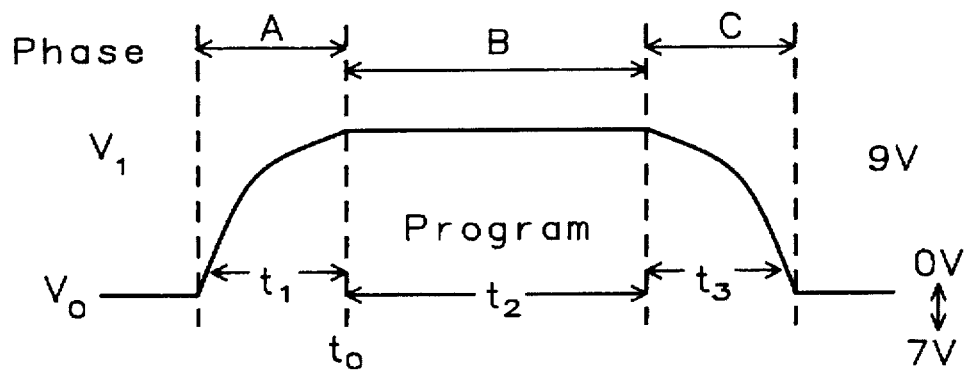
FIGS. 2B and 2C show the clipped sine waveform of the present invention in more detail.

As shown in FIG. 2B and table 1 (below), the clipped sine waveform to the control gate (Vg) comprises three phases: (1) an initial sine waveform phase A, (2) a clipped peak phase B, and (3) an ending sine waveform phase C. See FIG. 2b (e.g., the waveform has 3 phases (A—sine waveform ramp up; B—peak; and C—sine waveform ramp down)). T1 (phase A) preferably has a time between 20 ms (milli seconds) and 100 ms (tgt=50 ms (milliseconds). T2 (phase b) preferably has a time between about 100 and 500 ms (tgt=200) ms) and T3 ( phase C) preferably has a time between about 20 and 100 ms and a target of about 50 ms). T0 is the beginning of the program time.

The preferred voltages of programming and erasing are given below in table 1:

TABLE 1

Voltge and times for the Invention's Preferred Program and Erase cycles

Figure 2C:
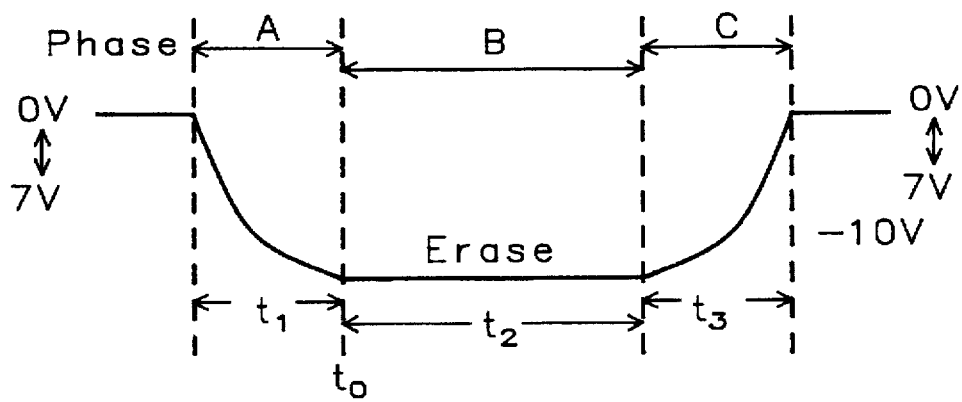
Figure 4A:
FIGS. 4A, 4B, 4C and 4D show the erase cycle voltage (including the clipped sine waveform (Vg)) for the present invention.
Figure 4B:
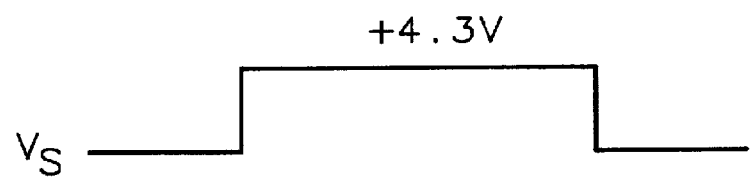
Figure 4C:
Figure 4D:
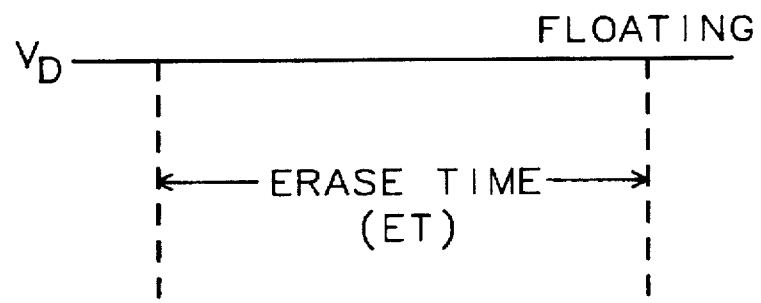

| Operation | Vg | Vd | Vs | $V_{well}$ |
|---|---|---|---|---|
| Program Cycle voltages | 9 to 11 V - Clipped Sine wave | (−4 to −6 V) | float | Ground |
| Program (times) | $t_1$ = 10 to 100 msec (tgt = 50)<br>$t_2$ = 100 to 500 ms<br>$t_3$ = 10 to 50 ms<br>see figure 2B | | | |
| Erase Cycle Voltages | −9 to −11 V Clipped Sine wave | Float | +4 to +5 V (tgt = 4.3 V) | Ground |
| ERASE (times) | $t_1$ = 10 to 100 ms<br>$t_2$ = 100 to 500 ms<br>$t_3$ = 10 to 100 ms<br>See FIG. 2C | | | |

The preferred voltages and times may vary with tunnel oxide, gate oxide thickness, P-well doping and N+ doping implantation concentration.

In more detail, as shown in table 1 above, for the erase cycle the relatively low positive pulse voltage to the source region preferably has a magnitude in the range of between about 4 and 5 volts. The well region ($V_{well}$ or $V_{p-well}$) is preferably grounded (at about 0 volts). The negative clipped sine waveform voltage (Vg) to the control gate preferably has a magnitude in the range of between about −9 and −11 volts.

II. Programming Cycle of the Invention

The invention's method for eliminating of cycling-induced electron trapping in the tunneling oxide of flash EEPROM devices in a program cycle is described below, shown in table 1 above, and shown in FIGS. 5A, 5B, 5C, and 5D to represent the beginning of the program time. T0 represents the beginning of the programming time.

A voltage ($V_d$) is applied to a drain region of the EEPROM devices during an entire program cycle (e.g., at least during t2) of between about −4 and −6V. A grounded voltage (Vwell) is applied to a well region of the EEPROM devices during an entire program cycle. The source region of the EEPROM devices is left floating during an entire program cycle (e.g., at least during t2). A positive clipped sine waveform voltage (Vg) is applied to a control gate of the EEPROM devices during the entire program cycle. The sine waveform reduces the electric field in the tunnel oxide which reduces the electron trapping. The clipped sine waveform voltage to the control gate (Vg) has a peak magnitude in the range of between about 9 and 11 volts.

Figure 5A:
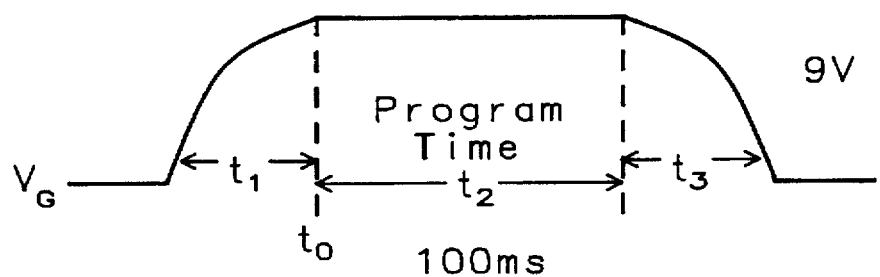
FIGS. 5A, 5B, 5C, and 5D show the program cycle including the clipped sine waveform (Vg) for the present invention for the erase cycle.
Figure 5B:
Figure 5C:
Figure 5D:
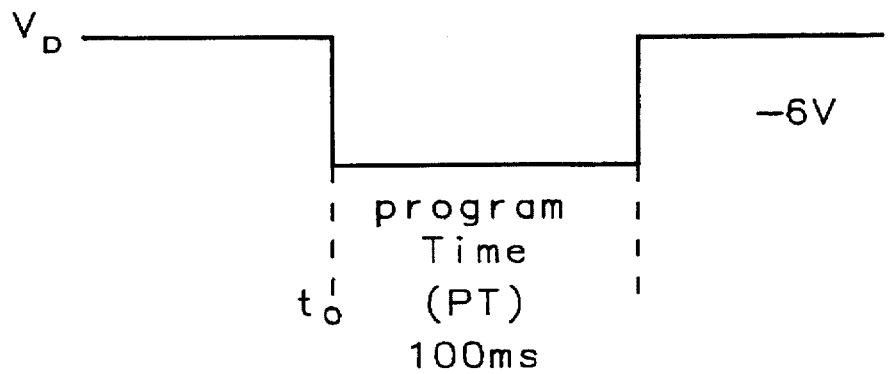

The clipped sine waveform to the control gate comprises three phases: (a) an initial sine waveform phase (b) a clipped peak phase and (c) an ending sine waveform phase as shown in FIG. 2B and FIG. 5A and as discussed above.

The initial sine waveform phase A—T0 preferably has a time period between about 10 and 100 ms. The clipped peak waveform phase B—T2 preferably has a time period between about 100 and 500 ms and more preferably between about 200 and 400 ms. The ending sine waveform phase C—T3 preferably has a time period between about 10 and 100 ms and more preferably between about 20 and 50. To is the beginning of the program cycle.

III. Carrier phenomena

In MOS devices, carriers can be injected either over an energy barrier (hot-carrier injection or through a barrier (tunneling by cold carriers). For Flash EEPROMS, the most important injection phenomena are: (1) Channel hot electron (CHE) injection and (2) Injection by Fowler-Nordheim tunneling. Hot carrier injection (e.g., CHE) implies that the injected carrier are no longer in equilibrium with the lattice at the point of injection (i.e., they posses far more kinetic energy than they would normally acquire from the ambient lattice temperature). They gain such energy upon being accelerated by the high channel field in the device. This is in contrast with the tunneling injection phenomena (e.g., FN tunneling), in which the carrier being inject is being injected in equilibrium with the Si lattice (i.e., they are "cold") and do not become hot until after they are injected into the oxide and are accelerated by the oxide field to the gate electrode.

The inventor has observed that the problem of electron trapping due to cycling was occurring when using the conventional rectangular pulsed voltages shown in FIGS. 1C and FIGS. 3A through 3C. In the preferred operation to program a device, a positive (+) voltage is applied to the gate and drain, source and −well (P-substrate). To erase, a negative (−) voltage is applied to the gate, and a relatively small voltage is applied to the source, p-Well (P-substrate) and the drain is normally left floating.

As shown in FIGS. 2A and 2B, the invention comprises applying clipped sine waveforms (Vg), not conventional rectangular pulsed waveforms (See FIG. 1C—the solid line 40 represents the clipped sine curve 42 and dotted line represents the continuation of the sine curve). To program, some electrons are injected into the floating gate in the initial sine wave phase A (e.g., the rising stage) to reduce the tunnel oxide field in the clipped peak phase (B). Therefore, this lowers the injection current. FN tunneling is used for both the erase and program cycles in the invention.

The conventional square—pulse waveform for the Vs in the erase cycle and the Vd in the program cycle create high field stress and a high injection current that creates the electron trapping. In contrast, the invention's sine waveform voltage (Vg) of the invention has a more gradual Voltage increase thereby more gradually increasing the field and injection currents. Therefore, the trapped charge is reduced and the cycling fail problem is ameliorated. In the erase cycle, some electrons are pushed out of the floating gate in the following stage.

The inventor theorizes that the invention's remarkable effect of reducing trapped electrons can be shown in the equations below. The equations below were analyzed to discover the relationships between the field and injection current and the change in Voltage Vg(t). These equations are given below:

$$I_{tun} = A E^2 \exp(-B/E) \tag{1}$$

Where:

$I_{tun}$ is the tunnelling current density through the tunnel oxide in traits (amps).

A is a constant=1.25 E-6 AV $E^2$ is the tunnel oxide field in units $(V/m)^2$

B is a constant=-240 MV/cm

E is the electric field across the tunnel oxide field at gate to drain (program) or at gate to source (erase)

$$V_{tun}(t)=K_w\ V_g(t)+Q_f(t)/Ct=E\ x_{tun} \quad (2)$$

where $V_{tun}(t)$=voltage for tunneling oxide
$K_w$ is coupling ratio
$V_g(t)$=control gate voltage as a function of time (in volts)
$Q_f(t)$ is the electron charge which was trapped at the floating gate
Ct=Total capacitance of the memory device (see FIG. 1b)
E=is the electric field across the tunnel oxide field
$x_{tun}$=is the tunneling oxide thickness $$dQ_f/dt=-I_{tun}(t) \quad (3)$$

Where $Q_f$=is the charge (electrons) in the floating gate in units C
$I_{tun}(t)$=tunneling current as function of time during erase or program) Amps $$K_w=C_{ono}/(C_s+C_{pw}+C_d) \quad (4)$$

where $K_w$=coupling ratio
$C_{ono}$=capacitance of the dielectric layer between the Floating gate and the control gate
$C_s$=capacitance of the source
$C_{pw}$=capacitance of the well
$C_d$=capacitance of the drain FIG. 1B shows the capacitance model of a CMOS device were some of the above variables are illustrated.
Current induced charge trapped $$Q\ tp \propto I_{tun}t \propto \alpha\ exp(-h/E) \quad (5)$$

where $I_{tun}$=tunneling current through the tunneling oxide in units—A.
t=time in msec
∝ proportional to
α=impact ion—ratio rate h is Planks constant 6.63X 1E-34 J-sec
E is in units V/M $$\alpha \propto exp(-h/E) \quad (6)$$

Where

α is impact ion ratio rate
h is Planks constant 6.63X 1E-34 J-sec
E is the electric field across the tunneling oxide In the conventional square pulsed wave (Vg) (see FIG. 3a), no electrons are in the floating gate, therefore we let Qf(0)=0.
For the conventional square waveform $$Vtunn(0)=Kw\ Vg(\ )+Qf(\ )/Ct=KwVg=Etun\ (0)\ X\ldots \quad (7)$$

For the clipped sine wave of the invention. (See FIGS. 4A, 5a). Some electrons are pushed to the floating gate in the rising range (A—curved sine portion of the wave), we let Qf(0)=-Qf.
for clipped sine waveform $$Vtun(0)=KwVg(0)+Qf(0)/Ct=KwVg-Qf/Ct=Etunn(0)\ X\ldots \quad (8)$$

By comparing equations (7) and (8), Etun(0) and Itun(0) for the conventional square step waveform are larger than for the invention's clipped sin waveform. Therefore, the oxide trapped charge (Qtp) for the conventional step waveform is greater than the Qtp for the invention's clipped sin waveform. Such that, the invention's clipped sine waveform (Vg) can improve the cycling induced EPROM endurance fail rates.

For the erase step, the same analysis applies. So, the invention's clipped sine waveform can also improve the cycling EEPROM endurance fail rates.

By analyzing the equations, it can be seen that (using the clipped sine wave) by more gradually increasing the Vg during the program cycle, some electrons will be pushed out to the floating gate. Also, some electrons will be pushed out to the floating gate Vs during the erase cycle. The electric field and injection currents (in the tunnel oxide) are reduced and the electron charge trapping is reduced. In summary, for the conventional square pulse waveform, the rapid change in Vg creates a High tunnel oxide Electric field. The high tunnel oxide electric field crease high injection currents which leads to more e⁻ trapping. In contrast, the invention's clipped sine waveform produces a low tunnel oxide Electric field because the some electrons are injected into the floating gate during the sine rising stage (A). This charge on the floating gate (before t=0) reduces the Qf(0)/Ct (see equation 1) and reduces the Electric field (E). The lower electric field, creates lower injection currents which gives lower e⁻ trapping.

The clipped sine waveform of the invention reduces electron trapping in memory devices, such as flash EEPROM devices during both program and erase cycles and thereby increases the performance of these devices. The voltages for the program and erase cycles of the invention can be varied higher or lower depending on the configuration of the semiconductor device as is known to those skilled in the art. Also, the method of the invention can be applied to different voltage technology products as they are developed (e.g., 12V to 5 V to 3.3 V, etc.).

While the invention has been particularly shown and described with reference to the preferred embodiments thereof, it will be understood by those skilled in the art that various changes in form and details may be made without departing from the spirit and scope of the invention.

What is claimed is:

1. A method for eliminating of cycling-induced electron trapping in the tunneling oxide of flash EEPROM devices in an erase cycle, said flash EEPROM devices comprising a source region, a drain region, a tunnel oxide layer, a control gate, a floating gate, and a well region in a substrate said method comprising the steps of:

a) applying a voltage to a source region of said EEPROM device during an entire erase cycle;
   b) grounding a well region of said EEPROM device during an entire erase cycle;

c) floating a drain region of said EEPROM device during an entire erase cycle;

d) simultaneously applying a clipped sine waveform voltage to a control gate of said EEPROM device during the entire erase cycle whereby the sine waveforms reduce the electric field in a tunnel oxide layer which reduces the electron trapping.

2. The method of claim 1 wherein said voltage to said source region has a peak magnitude in the range of between about +4 and +5 volts;

and said clipped sine waveform voltage to said control gate has a peak magnitude in the range of between about −9 and −11 volts.

3. The method of claim 1 wherein said clipped sine waveform to said control gate comprises three phases: (a) an initial sine waveform phase, (b) a clipped peak phase, and (c) an ending sine waveform phase;

said initial sine waveform phase having a time period between about 10 and 100 milli seconds; said clipped peak waveform phase having a time period between about 100 and 500 ms; and said ending sine waveform phase having a time period between about 10 and 100 ms.

4. The method of claim 1 wherein said clipped sine waveform to said control gate comprises three phases: (a) an initial sine waveform phase, (b) a clipped peak phase, and (c) an ending sine waveform phase;

said initial sine waveform phase having a time period between about 20 and 50 milli seconds; said clipped peak waveform phase having a time period between about 200 and 400 ms; and said ending sine waveform phase having a time period between about 20 and 50 ms.

5. A method for eliminating of cycling-induced electron trapping in the tunneling oxide of flash EEPROM devices in an erase cycle, said flash EEPROM devices comprising a source region, a drain region, a tunnel oxide layer, a control gate, a floating gate, and a well region in a substrate said method comprising the steps of:

a) applying a voltage to a source region of said EEPROM device during an entire erase cycle; said voltage to said source region has a peak magnitude in the range of between about +4 and +5 volts;

b) grounding a well region of said EEPROM device during an entire erase cycle;

c) floating a drain region of said EEPROM device during an entire erase cycle;

d) simultaneously applying a clipped sine waveform voltage to a control gate of said EEPROM device during the entire erase cycle; said clipped sine waveform voltage to said control gate has a peak magnitude in the range of between about −9 and −11 volts;

e) said clipped sine waveform to said control gate comprises three phases: (a) an initial sine waveform phase, (b) a clipped peak phase, and (c) an ending sine waveform phase; said initial sine waveform phase having a time period between about 10 and 100 milli seconds; said clipped peak waveform phase having a time period between about 100 and 500 ms; and said ending sine waveform phase having a time period between about 10 and 100 ms; whereby the sine waveform reduce the electric field in a tunnel oxide layer which reduces the electron trapping.

6. A method for eliminating of cycling-induced electron trapping in the tunneling oxide of flash EEPROM devices in a program cycle, said method comprising the steps of:

a) applying a voltage to a drain region of said EEPROM device during an entire program cycle;

b) grounding a well region of said EEPROM device during an entire program cycle;

c) floating a source region of said EEPROM device during an entire program cycle; and d) simultaneously applying a clipped sine waveform voltage to a control gate of said EEPROM device during the entire program cycle whereby the sine waveforms reduce the electric field in a tunnel oxide layer which reduces the electron trapping.

7. The method of claim 6 wherein said voltage to said drain region has a peak magnitude in the range of between about −4 and −5 volts;

and said clipped sine waveform voltage to said control gate has a peak magnitude in the range of between about +9 and +11 volts.

8. The method of claim 6 wherein said clipped sine waveform to said control gate comprises three phases: (a) an initial sine waveform phase, (b) a clipped peak phase, and (c) an ending sine waveform phase;

said initial sine waveform phase having a time period between about 10 and 100 milli seconds; said clipped peak waveform phase having a time period between about 100 and 500 ms; and said ending sine waveform phase having a time period between about 10 and 100 ms.

9. The method of claim 6 wherein said clipped sine waveform to said control gate comprises three phases: (a) an initial sine waveform phase, (b) a clipped peak phase, and (c) an ending sine waveform phase;

said initial sine waveform phase having a time period between about 20 and 50 milli seconds; said clipped peak waveform phase having a time period between about 200 and 400 ms; and said ending sine waveform phase having a time period between about 20 and 50 ms.

10. A method for eliminating of cycling-induced electron trapping in the tunneling oxide of flash EEPROM devices in a program cycle, said method comprising the steps of:

a) applying a voltage to a drain region of said EEPROM device during an entire program cycle; said voltage to said drain region has a peak magnitude in the range of between about −4 and −5 volts;

grounding a well region of said EEPROM device during an entire program cycle;

b) floating a source region of said EEPROM device during an entire program cycle; and c) simultaneously applying a clipped sine waveform voltage to a control gate of said EEPROM device during the entire program cycle; and said clipped sine waveform voltage to said control gate has a peak magnitude in the range of between about +9 and +11 volts; said clipped sine waveform to said control gate comprises three phases: (a) an initial sine waveform phase, (b) a clipped peak phase, and (c) an ending sine waveform phase;

said initial sine waveform phase having a time period between about 10 and 100 milli seconds; said clipped peak waveform phase having a time period between about 100 and 500 ms; and said ending sine waveform phase having a time period between about 10 and 100 ms;

whereby the sine waveforms reduce the electric field in a tunnel oxide layer which reduces the electron trapping.

* * * * *